United States Patent [19]

Acharya et al.

[11] Patent Number: 6,124,811
[45] Date of Patent: Sep. 26, 2000

[54] REAL TIME ALGORITHMS AND ARCHITECTURES FOR CODING IMAGES COMPRESSED BY DWT-BASED TECHNIQUES

[75] Inventors: Tinku Acharya, Tempe; Lina J. Karam, Phoenix; Francescomaria Marino, Tempe, all of Ariz.

[73] Assignee: Intel Corporation, Santa Clara, Calif.

[21] Appl. No.: 09/109,475

[22] Filed: Jul. 2, 1998

[51] Int. Cl.[7] .............................. H03M 7/30; H03M 7/46
[52] U.S. Cl. ............................ 341/63; 341/67; 382/240
[58] Field of Search ............................ 341/63; 382/240, 382/245, 246, 248, 239; 358/261.1

[56] References Cited

U.S. PATENT DOCUMENTS

| | | | |
|---|---|---|---|
| 4,988,998 | 1/1991 | O'Brien | 341/55 |
| 5,412,429 | 5/1995 | Glover | 348/398 |
| 5,488,486 | 1/1996 | Shimizu | 358/261.1 |
| 5,751,231 | 5/1998 | Iverson | 341/59 |
| 5,764,167 | 6/1998 | Adams et al. | 341/63 |
| 5,819,215 | 10/1998 | Dobson et al. | 704/230 |
| 5,940,540 | 8/1999 | Cornelissen | 382/245 |
| 5,966,465 | 10/1999 | Keith et al. | 382/232 |

*Primary Examiner*—Howard L. Williams
*Attorney, Agent, or Firm*—Blakely, Sokoloff, Taylor & Zafman LLP

[57] ABSTRACT

What is disclosed is a method that allows a fixed length codeword and flag to serve as a structure for encoding large run lengths, a sequence of such structures representing the number of zeroes between two non-zero values in a data set to be encoded. Also disclosed is an adaptive encoding technique that determines an encoding method suitable with the entropy characteristics of the data to be encoded. An architecture is disclosed which allows the size of the fixed length to be varied, if needed. This architecture includes a plurality of logic networks coupled to a single counter, each of which may be enabled depending on the desired codeword size.

37 Claims, 6 Drawing Sheets

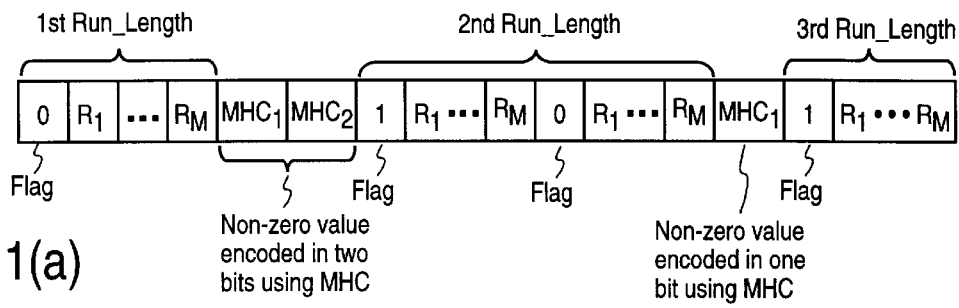

Fig. 1(a)

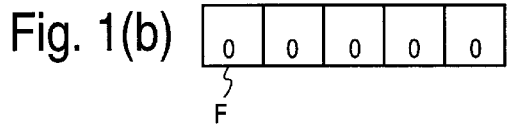

Fig. 1(b) M=4, F,R=0,0
indicates that only zeroes are present till the end of the examined band.

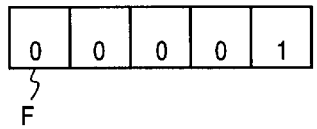

Fig. 1(c) M = 4, F,R = 0,1
indicates that the following non-zero value is adjacent to the previous one. This structure is followed by the Modified Huffman coding of the non-zero value.

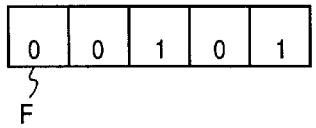

Fig. 1(d) M = 4, F,R = 0,5
indicates that 4 zeroes are in the run. This structure is followed by the Modified Huffman coding of the non-zero value.

Fig. 1(e)

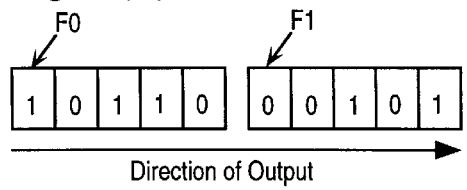

Direction of Output

M = 4,
[F0, R0] = 1, 6
[F1, R1] = 0, 5
F0=1 indicates that 6 (i.e., R0) is only a part of the number coding run. F1=0 denotes that R1=5 is the most significant part of the run. Therefore, the number (56)16=86 indicates that the run length is of 86-1=85 zeroes. These two structures are followed by the Modified Huffman coding of the non-zero value.

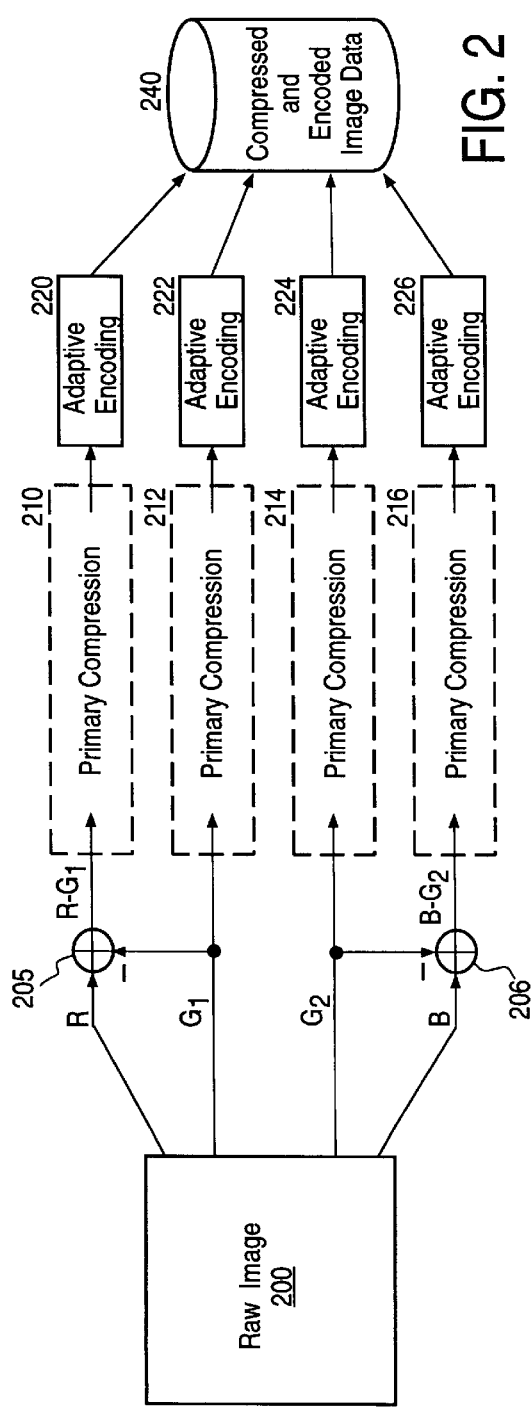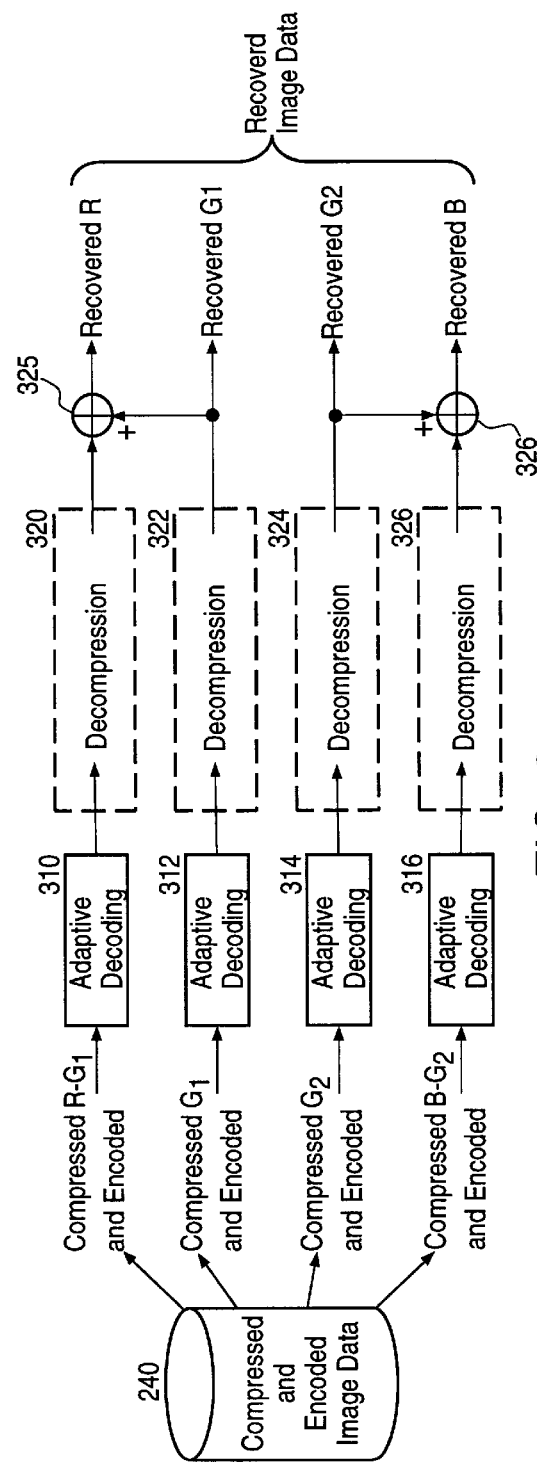

REAL TIME ALGORITHMS AND ARCHITECTURES FOR CODING IMAGES COMPRESSED BY DWT-BASED TECHNIQUES

BACKGROUND OF THE INVENTION

1. Field of the Invention

The invention relates generally to data and image compression. More specifically, the invention relates to binary encoding for data and image compression, particularly where adaptive quantization and discrete wavelet transforms are utilized.

2. Description of the Related Art

In image and/or data compression, through a process known as encoding, a set of values, such as text or numerical data that are obtained or input externally, can be encoded into binary form (1s or 0s). One way of encoding is to simply convert each decimal number or code for text (such as ASCII numerical designations) into a fixed number of bits (word size). For instance, the numbers 23, 128, and 100 would be encoded into binary as the sequence: 00010101 1000000 01100100. This raw or pure binary code serves no further compression function, since it merely takes the data and represents it in binary. Such encoding is inefficient where the number of zeroes greatly outweigh the non-zero, and especially where such zero data values are consecutive, creating a large "run" of zeroes in binary. Several methods have been developed particularly in the field of digital communications to compress data during binary conversion. Among two widely-used such methods of binary encoding for image or data compression are Huffman Coding and Run-Length Encoding.

Classical Huffman Coding is a variable length coding technique which consists of coding each possible value $y_i$(i=1, ... , N) inside a given data set S of N possible data values by codewords of $L_i$ bits each. The goal behind Huffman Coding is to minimize $\Sigma L_i P(y_i)$, where $P(y_i)$ is the probability of the value $y_i$ occurring in data set S that is to be encoded. The codewords are chosen in order to make them distinguishable from each other. The codewords have a variable length, for instance, for a data set S={0, 1, 2, 3, 4} the Huffman Coding may use the mapping {0=0, 1=10, 2=110, 3=1110, 4=1111}. If P(0)>>P(1)>>P(2)>>P(3)>>P(4), this technique may be more efficient than straight fixed length binary representation. The Huffman Coding is efficient primarily when coding data sets S with a small N or that have a small variance, since $L_i$ grows in size almost linearly with an increase in N, the number of values in the set. For this reason, a technique different from classical Huffman Coding known as Modified Huffman Coding has been developed and used in image that have larger N in their data sets or more variance.

In Modified Huffman Coding, the data value $y_i$ is encoded by a data structure having two fields: a Range, (that identifies a set containing $2^{Range}$ values) and a Pointer indicating a specific value inside Range. The field Range is coded using Huffman coding, and Pointer is expressed as a binary number having a size of Range bits. As an example, the values included in a Range of 1 to n could be:

Range=0: values {0} (the field Pointer is not needed)
Range=1: values {−1, 1} (the field Pointer needs 1 bit to indicate a specific value).
Range=2: values {−3, −2, 2, 3} (the field Pointer needs 2 bits).
Range=n: values {$-2^n+1, -2^n+2, \ldots, -2^{-1}, 2^{n-1}, \ldots, 2^n-2, 2^n-1$} (the field Pointer needs n bits).

For instance, if the data to encode are the integer values {−3, −2, −1, 0, 1, 2, 3}, a possible MHC for each of them could be that shown in the Table 1:

TABLE 1

| $y_i$ | Range | Huf. Code for Range | Pointer having Range bits | Complete code (MHC) |
|---|---|---|---|---|
| −3 | 2 | 11 | 11 | 1111 |
| −2 | 2 | 11 | 10 | 1110 |
| −1 | 1 | 10 | 1 | 101 |
| 0 | 0 | 0 | — | 0 |
| 1 | 1 | 10 | 0 | 100 |
| 2 | 2 | 11 | 00 | 1100 |
| 3 | 2 | 11 | 01 | 1101 |

The value 0 is coded only by a word 0 (i.e., the Huffman coding of the Range and no other bits). The value 3 is coded by 1101, where the underlined 11 is the Huffman code of the Range 2, and the following 2 (=Range) bits, 01, "point" to the value 3 among the possible values {−3, −2, 2, 3} that also have a Range=2 in the table. If P(0) is high, the above described approach is more efficient than a normal fixed length binary coding where each value would be coded by 3 bits regardless of its probability of occurrence, since only one bit in the MHC of Table 1 is used for zero values. The MHC is naturally designed for a table look-up architecture and thus can be more efficient for both encoding and decoding.

Another technique known as Zero Run Length Coding (ZRLC) is a standard technique for encoding a data set containing a large number of consecutive or "runs" of zero values. ZRLC consists of encoding only the values different from zero (using Huffman Coding or some other coding) and then interleaving these codewords by a code that specifies the number of zeroes that, according to a manner known both to the coder and to the decoder, divides two consecutive non-zero values.

In traditional ZRLC, the encoded zero run data is structured using two segments: a run length and non-zero value. For instance, instead of coding the data stream:
{0 0 0 0 0 0 5 0 0 0 −6 7 8 0 0 0 0 −12 0 0 0 0 0 0 0 0 0 0 0 0 1 4 5 0 0 0 0 0 0 0 0 0 0 2 3} only the following data are coded:
{[6, 5][3, −6][0, 78][4, −12][12, 1][0, 45], [9, 23]}

This code (where an indicates a run length of zeroes) indicates that 6 zeroes followed by the value 5, then 3 zeroes followed by the value −6, then 0 zeroes followed by the value 78, ... , etc.

When either of these techniques are utilized in the compression of images, the nature of the image compression prior to encoding scheme should point to the best choice of method. In order to consider whether Huffman Coding or run length coding should be used, the nature of the image or application (such as videoconferencing) may need to be analyzed and considered. For images with high entropy, run-length encoding may not provide as high a compression ratio as Huffman Coding and vice-a-versa. The inability to tune the binary encoding process to the characteristic of the data set (or subset of the data set), may result in overall compression ratios that are not optimal.

In the art of imaging, after an image is captured (by a device such as a digital camera) and perhaps "color interpolated" (missing color components are determined to give the image full color resolution) then the image is often "compressed" (prior to binary encoding) or reduce the total number of bits that would be needed to represent the image. "Primary" image compression and subsequent binary encoding of that compressed data plays a key role in multimedia applications such as videoconferencing, digital imaging and video streaming over a network. Primary image compression schemes for such applications should be designed to reduce the bit-rate of storage or transmission of the image while maintaining acceptable image quality for the specific application.

One commonly used primary image compression technique is known as JPEG (Joint Photographic Experts Group) which transforms pixels of an input image using the well-known Discrete Cosine Transform (DCT). The resulting transformed pixel values are quantized or mapped to smaller set of values in order to achieve compression. The quality of a compressed image that is decompressed will depend greatly on how the quantization of the transformed pixels are performed. The compression ratio (the size of the original raw image compared to the compressed image) will also be affected by the quantization, but can be further affected by the subsequent binary encoding of the data after quantization.

The subsequent binary encoding of JPEG compressed image data is limited, if run length encoding is used, by "blocking". For JPEG, an image is divided into blocks of pixels such as 8×8, or 16×6 blocks. These blocks are processed independently of each other and thus, the maximum run-length possible is the size of the block (64 or 256). Thus, if run-length encoding is used, the run-length value is 6 bits or 8 bits wide. Hence, for JPEG, run-length encoding may held fixed in the number of bits comprising the run-length. Where block-based coding is not utilized, such fixed number of bits for coding each "run" (i.e., the number of consecutive zeroes), can become a serious limit, since the longest value for a run depends from the dimension of the whole image.

Other primary image compression schemes which achieve high compression ratios and also acceptable decompressed image quality, may generate image "sub-bands" or image frequency regions, which unlike JPEG blocks, are not fixed but varying in size since they do not divide the image in blocks. One such primary image compression scheme based upon the Discrete Wavelet Transform (DWT) is presented in related U.S. patent application, Ser. No. 09/083,383, filed May 21, 1998, entitled "The Compression of Color Images Based on a 2-Dimensional DWT" (hereinafter "DWT Patent"). In such a DWT-based scheme, each sub-band and channel (color plane or difference of color planes) may have properties that justify the use of Huffman Coding rather than run-length encoding especially in sub-bands with high entropy.

If images are to be compressed and then encoded on a digital camera or other imaging device, ordinary run-length encoding for JPEG is inadequate. Thus, there is a need for a run-length encoding scheme which allows a variable and exceptionally large run-length value to be encoded while keeping a fixed length structure such that decoding can be more real-time. Further, where primary image compression generates data in stages (e.g., one stage for each sub-band), where the data at each stage has properties which favor the use of one type of encoding over another, there is a need to provide an adaptive encoding process so that each stage may be treated with the most efficient encoding possible. Such mechanisms would maximize the compression gained during encoding and thus, reduce the storage/transfer size required for an image or for other data.

SUMMARY OF THE INVENTION

A method comprising determining the number of bits utilized to store a word R, the word R accompanied by a flag, the flag and word R comprising a structure; and encoding the length of a run larger than allowable by the number of bits of the word R even if each of said bits were fully utilized, said encoding achieved by stringing together a plurality of such structures. In an alternate embodiment, for a DWT-based image compression, there is a method for determining which of a plurality of encoding schemes applies to each sub-band and channel of data.

BRIEF DESCRIPTION OF THE DRAWINGS

The objects, features and advantages of the method and apparatus for the present invention will be apparent from the following description in which:

FIGS. 1($a$)–1($e$) are the essential data structures for modified zero run length encoding according to one embodiment of the invention.

FIG. 2 illustrates image processing data flow according to one embodiment of the invention.

FIG. 3 illustrates recovery of a compressed and encoded image according to one embodiment of the invention.

DETAILED DESCRIPTION OF THE INVENTION

Figure 4:
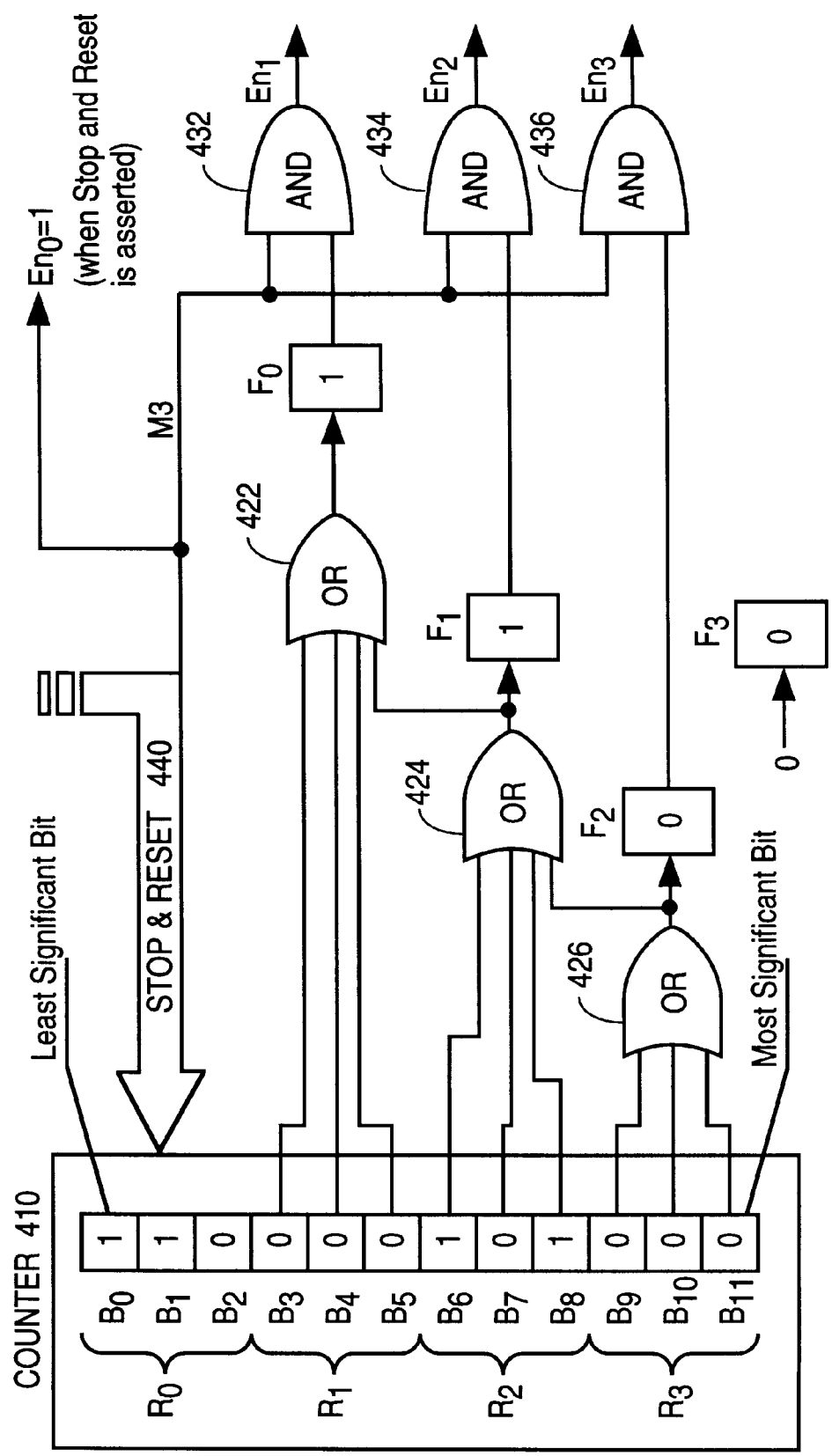
FIG. 4 is a diagram of a modified zero run length encoder according to one embodiment of the invention.

Referring to the figures, exemplary embodiments of the invention will now be described. The exemplary embodiments are provided to illustrate aspects of the invention and should not be construed as limiting the scope of the invention. The exemplary embodiments are primarily described with reference to block diagrams or flowcharts. As to the flowcharts, each block within the flowcharts represents both a method step and an apparatus element for performing the method step. Depending upon the implementation, the corresponding apparatus element may be configured in hardware, software, firmware or combinations thereof.

FIGS. 1($a$)–1($e$) are the essential data structures for modified zero run length encoding according to one embodiment of the invention.

In the JPEG standard, because of the 8×8 blocking strategy, the size of the run in the ZRLC may assume a value not higher than 63 and thus can be fixed to 6 bit word. If we consider an entire sub-band generated by a 2-D DWT, the upper limit on the size of the run value depends on the size of the whole image. Therefore, one embodiment of the invention provides a flexible structure for encoding the size of the run defined as the number of zeroes between two non-zero values). The structure encoding is composed of a Flag F and a word R of M bits. FIG. 1($a$) shows the basic format of the encoded data. In this format, one or more structures of the type (F, R) is followed by an MHC (Modified Huffman Code) of any non-zero values in the data set. Each ZRLC structure (F, R) has a one-bit F value and bits $R_1 \ldots R_M$. Thus, in FIG. 1($a$), the first run length is encoded by one structure (F, R). The run length, by definition, terminates when a non-zero value is encountered. The exemplary non-zero value is encoded using two bits $MHC_1$ and $MHC_2$. After the non-zero value a second run of zeroes which exceeds $2^M-2$ in length is encoded using two (F, R) structures. The next non-zero value is encoded using $MHC_1$ (only a single bit), after which another run length of zeroes is encoded with one (F, R) structure only. A structure of (F, R)=(0, 0) shown in FIG. 1(b) specifies that only zeroes are present from that point to the end of the examined band. For indicating a run of r zeroes (where $r<2^M-1$), (F, R)=(0, 1+r) is used. A structure of (0, 1) shown in FIG. 1(c) denotes that the following non zero value in the path is adjacent to the previous non-zero value, i.e., a run of R−1 zeroes occurs between two consecutive non zero values. Thus, a run of 4 zeroes would be encoded by the structure (0,5) as shown in FIG. 1(d).

If r (the total size of the run) is longer than $2^M-2$, we use $\lceil \log_2(r-2)/M \rceil$ structures, (where $\lceil y \rceil$ denotes the rounding of y to the lowest integer larger than y) each structure storing Mbits of r and having F=1, except for the terminal or last structure where F=0. An example of an r longer than $2^M-2$ is shown in FIG. 1(e). When the run length r is greater than $2^M-2$, a flag F=0 is used to represent the most significant M-bits of r. FIG. 1(e) shows a structure for encoding the fact that 85 zeroes are in the run length. Since M, the size of the word R in the (F,R) structure is only 4 bits long, only a run length of 14 can be encoded by a flag 0. Thus, the flag F=0 is used to indicate the most significant part of the run length figure. The number 86(1+r) would encode the fact that 85 zeroes are in the run length which is r. In binary, $86_{10}$ is 0101 1100, the first M bits (M=4) of this run length figure is 0101. Thus, this first part is encoded as (F,R)=(0) or 0 0101. The second and final part of the value to be encoded 1100 carries a flag of F=1, indicates that it belongs to the previously encoded value "0101." A run length of 250 would be encoded by (F,R)=(0,$F_{16}$); (1,$B_{16}$) where $F_{16}$=1111 and $B_{16}=1011_b$, since $(1111\ 1011)b=251_{10}$, which is 1 greater than r, the run length of 250. Similarly, a run length of r=4091 can be encoded by the structures (0,$F_{16}$); (1,$F_{16}$); (1,$C_{16}$) where $(FFC)_{16}=4092_{10}$. The order of output, as shown in FIG. 1(e) has the structures of flag 1, from least significant bit of the run size to most significant bit (with a structure of F=0) from left to right. For example, FIG. 1(e) shows that the most significant bits are output last (with the flag F=0) in encoding the run length 85. Likewise, the run length 250 would be output in the order (1,$B_{16}$) (0,$F_{16}$), and the run length 4091 would be output in the order (1,$C_{16}$) (1,$F_{16}$) (0,$F_{16}$). Likewise, any number of structures in the output order (1,$R_0$) (1,$R_1$) (1,$R_{I-2}$) (0,$R_{I-1}$) may be used where I×M bits is the total number of bits required to encode r+1. In this scenario I-1 structures have a flag of 1, while the Ith structure has a flag of 0. One advantage of the modified ZRLC in one embodiment of the invention is that the size of the run may be unlimited and still encodable using a fixed length structure (F,R) of R having only M bits.

For coding the non-zero value following each run, we chose an MHC technique with the following possible Range values:

0={1}
1={−1, 2}
2={−3, −2, 3, 4}
n={$-2^n+1$, $-2^n+2$, ..., $-2^{n-1}$, $2^{n-1}$, ..., $2^n-1$, $2^n$}

An example of a LUT for such values is shown in the Table below. The case of y=0 is not encompassed by this MHC since ZRLC handles all occurrences of zero values in the data set.

TABLE 2

| Address (=y) | Non Zero Value size | code |
|---|---|---|
| −3 | 11 (=3) | <u>11</u>11 |
| −2 | 11 (=3) | <u>11</u>10 |
| −1 | 10 (=2) | X<u>10</u>1 |
| 1 | 00 (=0) | XXX<u>0</u> |
| 2 | 10 (=2) | X<u>10</u>0 |
| 3 | 11 (=3) | <u>11</u>00 |
| 4 | 11 (=3) | <u>11</u>01 |

In this example, a look-up table (LUT) be constructed such that each cell is addressed by y (i.e. the data to be encoded) and contains 6 bits. The first 2 bits (the field "size") are read and only "size"+1 bits of the field "code" are considered and stored as effective information. Among these "size"+1 bits, the most significant and underlined bits are the field "range" coded using Huffman Coding (in this example the ranges 0, 1 and 2 are respectively coded by <u>0</u>, <u>10</u> and <u>11</u>), while the least significant bits constitute the field "pointer". For example, −2 is coded by the word "<u>11</u>10" (i.e. "range"= 11 and "pointer"=10).

Since an efficient implementation of the Huffman coding requires a certain statistic analysis, the LUT coding the MHC for the non zero values in ZRLC, in one embodiment of the invention, one can determine an optimal set of such codes based on an analysis of exemplary images. Appendices A–E show such codes arrived by experimentally considering over 50 different images for each sub-band of each channel as a result of these images being subjected to the image compression scheme used in the DWT PATENT. The DWT filters used for transforming the images utilized in the analysis were the 9-7 biorthogonal splines filters, the same DWT utilized in the DWT Patent.

FIG. 2 illustrates image processing data flow according to one embodiment of the invention.

It is desirable in digital applications such as still or motion imaging that an original image such as one captured by a digital camera be compressed in size as much as possible while maintaining a certain level of quality prior to its being transferred for decompression and/or display. The primary image compression technique disclosed in the DWT Patent has been specifically developed to adaptively utilize the response of the human visual system to color and light to maintain image quality. After this compression, according to one embodiment of the invention, an adaptive binary encoding is applied to further compress the data.

As mentioned in the DWT Patent, a raw image that is captured by a digital camera or other similar device will typically be represented in a Bayer pattern. The sensor array 200 is a set of pixel locations or that contain at each location, an intensity value of the light incident upon the sensors from the environment/scene being imaged. In a Bayer pattern, each pixel location of an image such as raw image 200 will have an association with a color plane—Red(R), Green(G), or Blue(B). Since the Bayer pattern has two associated values for every R and B, the Green color plane may be considered as two planes G1 and G2.

According to the image compression technique in the DWT Patent, the correlation between color planes R, G1, G2 and B are exploited such that four "channels" are generated and separately compressed. The G1 and G2 associated pixels are passed directly to compression (blocks 212 and 216) and comprise two of the channels. The R and B pixels are treated less directly. The R pixel value is subtracted by its west neighboring G1 pixel value (block 205). This difference (R-G1) channel is passed to compression (block 210). Likewise, each B associated pixel is subtracted from its east neighboring G2 associated pixel (block 206). This difference (B-G2) channel is then passed to compression (block 216).

These different channels along with the G1 and G2 pure color channels are each passed to appropriate compression stages (quantization and DWT).

Each of the four channels, R-G1, G1, G2, and B-G2 are passed to compression blocks 210, 212, 214, and 216, respectively. In each compression block 210, 212, 214 and 216, according to the DWT Patent, two processes occur. The first process is a 2-Dimensional Discrete Wavelet Transform (2-D DWT). The 2-D DWT generates "sub-bands" of the image as shown and described in the DWT Patent. After or during the DWT, a second process known as quantization is also performed.

Quantization is the procedure of mapping a set of n possible values to a set of m possible, where m<n. By quantizing, the total number of possible data values for the DWT image data set is reduced. Adaptive blocks 220, 222, 224 and 226 encoding arranges (packs) the sub-band data from compression blocks 210, 212, 214 and 216, respectively, so that it has an efficient binary representation. Adaptive encoding blocks 220, 222, 224 and 226, according to one embodiment of the invention, employ an optimal method of encoding to each sub-band and channel combination generated by the compression process. Modified ZRLC, as defined in embodiments of the invention, is utilized along with the well-known pure Modified Huffman Coding (MHC). Depending on which channel and sub-band of compressed data is being encoded, one of these two methods will be employed. Additionally, since modified ZRLC uses a fixed number of bits M for R in the structure (F,R), the number M can be varied according to the sub-band and channel being encoded. For instance, in a sub-band with higher entropy to encoding, a smaller value of M may be chosen. The following Table 3 shows optimal encoding strategies which have been empirically arrived for a given sub-band and channel in the case of a DWT performed on Bayer pattern (raw) images using the 9-7 biorthogonal spline DWT filters and quantizing the resulting DWT coefficients by means of the perceptually lossless thresholding as described in the DWT Patent.

sub-bands use pure MHC. Though FIG. 2 shows the example of the image compression technique used as being that presented in DWT Patent, any image compression technique which generates data in stages or sub-regions that have differing characteristics can utilize an adaptive encoding such that encoding is optimized to each. The compressed and encoded image data 240 may then be stored onto some medium, transmitted from one system to another or distributed over a communication pathway such as a network. Further, the compressed and encoded image data need not be collected and transferred as a single frame, but can be streamed, encoded value by encoded value, out to its destination.

Depending upon the precise parameters used for DWT transformation, quantization and encoding, the compression ratio, which the size of the original image divided by the size of the compressed image, will vary. This embodiment of the invention provides for an adaptive encoding process that can serve to advantageously optimize the compression ratio in each channel and sub-band generated by the compression process mentioned in the DWT Patent.

One important aspect of the invention which is described in FIGS. 1(a)–1(e) and FIGS. 4 and 5 is a modified zero run length encoding scheme. The modified ZRLC may be utilized in any image or data compression process, the use of the compression process from the DWT Patent is merely exemplary. Likewise an adaptive encoding procedure provided in another embodiment of the invention that is shown responsive to sub-band properties and channel properties may also be modified to be responsive to other types of stage or sub-region generating image compression.

FIG. 3 illustrates recovery of a compressed and encoded image according to one embodiment of the invention.

The decoding blocks, inverse quantization blocks and inverse DWT blocks comprise a process which attempts to recover the run image 200 from the compressed and encoded image data 240 (see FIG. 2).

The compressed and encoded image data 240 may be efficiently stored channel by channel and sub-band by sub-band. Thus, the compressed and encoded channels (R-G1), G1, G2 and (B-G2) may be separately decoded and decompressed. First, the data belong to each channel and sub-band is decoded (blocks 310, 312, 314 and 316). The adaptive

TABLE 3

|  | DWT Sub-Bands Channels | | | | | | | | | | |
| --- | --- | --- | --- | --- | --- | --- | --- | --- | --- | --- | --- |
|  | $LH_1, HL_1$ | $HH_1$ | $LH_2, HL_2$ | $HH_2$ | $LH_3, HL_3$ | $HH_3$ | $LL_3$ | $LH_4, HL_4$ | $HH_4$ | $LL_4$ |
| $G_1, G_2$ | $ZRLC_2$ | $ZRLC_3$ | MHC | $ZRLC_2$ | MHC | MHC | MHC | MHC | MHC | MHC |
| R-G | $ZRLC_3$ | NU | $ZRLC_2$ | $ZRLC_3$ | $ZRLC_2$ | $ZRLC_2$ | MHC | MHC | MHC | MHC |
| B-G | $ZRLC_2$ | NU | $ZRLC_2$ | $ZRLC_3$ | $ZRLC_2$ | $ZRLC_3$ | MHC | $ZRLC_2$ | $ZRLC_2$ | MHC |

(NU = not used)

In the above Table 3, MHC refers to the well-known Modified Huffman Coding, while $ZRLC_M$ refers to modified ZRLC as shown in FIGS. 1(a)–1(e) and FIG. 4, where M is the number of bits in the structures encoding the run length. In all cases, $ZRLC_M$ encodes non-zero values using an MHC. The sub-bands $LH_K$, $HL_K$, $HH_K$ and $LL_K$ refer to the various sub-bands created at each level or iteration K of the DWT (see DWT Patent).

Thus, each sub-band and channel is encoded according to its characteristics. For instance, the $HH_2$ sub-band for channels G1 and G2 uses ZRLC with M=2, while $LH_2$ and HL2 encoding (blocks 220, 222, 224 and 226) shown in FIG. 2 necessitates that a decoding appropriate to the type of encoding applied for data of given sub-band and channel, be utilized. Each channel and sub-band of data, may have been encoded using techniques different from those of other sub-bands, and channels, thus, will need to be decoded taking any differences in encoding technique into account. Each channel of decoded data is then decompressed (blocks 320, 322, 324 and 326). As with the compression blocks shown in FIG. 2, the decompression consists of two procedures—dequantizing the decoded data and then performing an inverse DWT (IDWT). The decompression stage is more fully discussed in the DWT Patent.

Once the decompression is completed, an approximation of the raw image 200 may be obtained pixel by pixel. By adding back G1 to the (R-G1) recovered value (block 325) and G2 to the (B-G2) recovered value (block 326), each Bayer pattern pixel value R, G1, G2 and B from the original raw image 200 may be approximately recovered.

The adaptive decoding can be implemented as hardware, software or from one or a combination thereof and can be separate physically from the apparatus performing the function of the encoding compression process. The basic data flow for image processing that consists of compression and recovery may also include an intermediate transfer from the compression block to the desired system or process which has the desired recovery capability needed.

FIG. 4 is a diagram of a modified zero run length encoder according to one embodiment of the invention.

A modified zero run length encoder where the number of bits M for the word R is 3 may be implemented by a counter 410 and logic network as shown in FIG. 4. Counter 410 is utilized to determine the total length of the run in binary. Counter 410 which is shown to 12 bits in the example may have any number of bits that is desired in the system. According to one embodiment of the invention, a k-bit counter is capable of encoding a maximum run length value run__max=$2^k$-2 (k is chosen such as run__max is not smaller than the dimension of the largest whole sub-band or image). Each consecutive "zero" encountered in the data stream will increment the counter by 1, and upon encountering a non zero value, the counter 410 would be reset (to 000000000001), awaiting the next run of zeroes. The counter 410 is shown in FIG. 4 in a state where a run length (r) of 0001010000010 or 322 zeroes is being encoded. The counter 410 holds the value 1+r or 000101000011. This run length needs to be represented by data structures ($F_i$,$R_i$) and since M, the length of $R_i$, equals 3, the value in counter 410 is considered 3-bit segments of which there are 4, $R_0$, $R_1$, $R_2$ and $R_3$. Additionally, it may be the case that not all 4 available data structures need to be output. For instance, in the example of FIG. 4, the value 0001010000011 has three leading zeroes which do not need to be output. Thus, for each data structure ($F_i$,$R_i$) an enable signal $En_i$ is generated such that when $En_i$=1, the data structure ($F_i$,$R_i$) is output and when $En_i$=0, it is not. FIG. 4 shows that $En_0$ is always enabled when a STOP and RESET is asserted such that ($F_0$,$R_0$) is always output when a non-zero value (encoded for instance by MHC) is encountered.

The data structures are output in an order such that ($F_{i-1}$,$R_{i-1}$) precedes ($F_i$,$R_i$). Thus, in the example of FIG. 4, the data structure ($F_0$,$R_0$) would be followed by ($F_1$,$R_1$) and then ($F_2$,$R_2$). According to one embodiment of the invention, each field $R_i$ in the data structures (1,$R_i$) is used to compose a single run until a structure (0, $R_j$) is encountered. The flag F=0 for such structure indicates that the bits of $R_j$ are the most significant of a binary number composed by all the other bits of the previously encountered words $R_i$ coded in structures (1,$R_i$), i.e., having F=1. A flag of zero for a structure indicates that all bits of the run size have been encountered. Accordingly, a pair of 4-input OR gates 422 and 424 are provided that have as input the OR gate result of the successive structure. Thus, one input to OR gate 422 is the output of OR gate 424, and for OR gate 424, one input is the output of a three-input OR gate 426. The other three inputs of OR gate 422 are the bits of $R_1$ while the other three inputs of OR gate 424 are the bits of $R_2$. The three bits of $R_3$ form the input of OR gate 426. This cascading OR gate structure implements the ability to output and flag correctly as many structures as are needed to represent the run length.

The structure ($F_i$,$R_i$) is output if the state of enable signal $En_i$ is 1. A two-input AND gates govern each enable signal with the exception of $En_0$. En0 is directly controlled by the signal "STOP & RESET" 440 (i.e., is set to 1 when the a non zero value is encountered and therefore the signal "STOP & RESET" 440 is forced). $En_1$ is the output of AND gate 432, while $En_2$ is the output of AND gate 434 and $En_3$ is the output of AND gate 436. The AND gates have as one input the signal $M_3$ (which is $En_0$) and have as the other input the flag F belonging to the successive structure. When that flag F is zero, then the end of the run length number has been encountered. For instance, in the example of FIG. 4, $F_2$=0 and thus, $En_3$ is set to zero, indicating that ($F_3$,$R_3$) does not need to be output. In the example shown, $En_0$, $En_1$, and $En_2$ are all 1 when "STOP & RESET" is asserted, concordant with the necessity of outputting only structures ($F_2$,$R_2$) ($F_1$,$R_1$) and ($F_0$,$R_0$). Note that even though the $R_1$ is 000, the structure ($F_1$,$R_1$) is nonetheless output since it forms an part of the run length number 101000010 (which is being encoded as 101000011). By contrast, the leading three zeroes that compose ($F_3$,$R_3$) are not output since they are not essential to representing the run length value in the example.

The flags $F_i$ are arrived at by considering the output of the OR gates. The flag $F_3$ must always equal zero since it by necessity forms the most significant part of any run length value for the given example of the 12-bit counter. When the run length is less than or equal to 2M-2, then according to one embodiment of the invention, only ($F_0$,$R_0$) would need to be output. In this case, the flag $F_0$ would need to be 0, according to the data structure definition of FIG. 1(d). A run length less than or equal to $2^M$-2 would indicate that the counter will not have filled the bits in the $R_1$, $R_2$, and $R_3$ portions of counter 410. Following the cascading OR gate structure, OR gate 426, 424 and 422 would all show 0 at their output. Thus, $F_0$ would be set to 0. as it should. As a result of the OR gates 426, 424 and 422 showing 0 at their output, in the case where run length is less than $_2M-_1$, $En_{,,}$, $En_2$ and $En_3$ would also be zero, and thus the structures ($F_1$,$R_1$), ($F_2$,$R_2$) and ($F_3$,$R_3$) would be disabled and not output. Since $En_0$=1 in all cases, the structure ($F_0$,$R_0$) would be output and would adequately represent any run length value in the range 0 to $2^M$-2. The ZRLC encoder may be modified depending upon the choice of M and desired total range of the counter.

Figure 5:
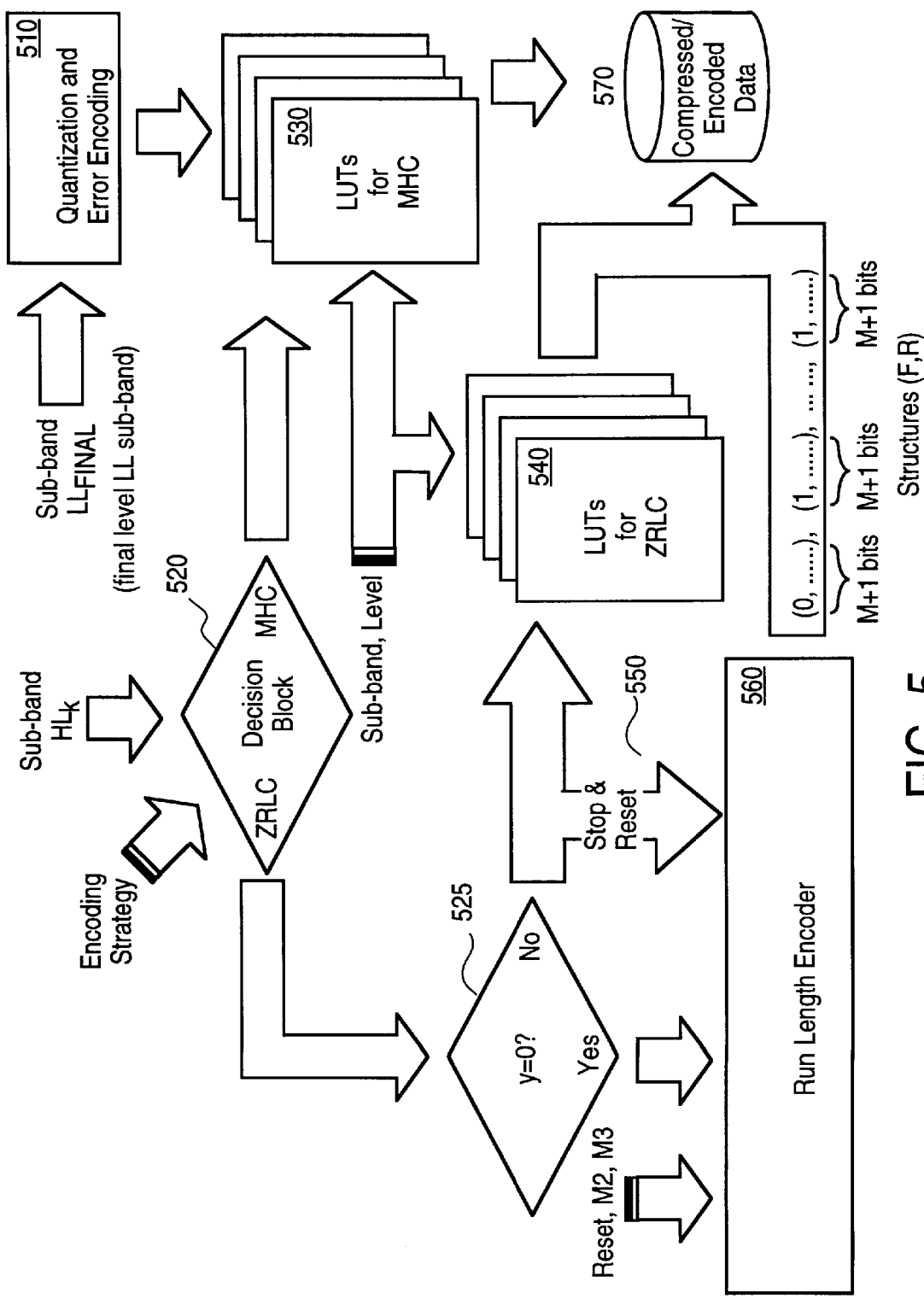
FIG. 5 is a block diagram of an adaptive encoder according to one embodiment of the invention.

FIG. 5 is a block diagram of an adaptive encoder according to one embodiment of the invention.

At each level k of the DWT, as mentioned in the DWT Patent, the $LL_k$, the $LH_k$, the $HL_k$ and the $HH_k$ sub-bands are generated starting from the sub-band $LL_{k-1}$, (for k=1, the starting data set is the image itself). The $LL_k$ sub-band, according to the DWT Patent, is transformed in order to generate the other three sub-bands of the level k+1. The sub-bands $LH_k$, $HL_k$ and $HH_k$ are then quantized and coded. When the DWT is iterated in a "pyramidal" way over the sub-band LL until the last level of DWT resolution being obtained the final level LL sub-band is quantized and coded. The other $LL_k$ sub-band do not need quantizing and encoding since they are represented by virtue of being further transformed into sub-bands of the next level.

The encoding of the sub-bands that are other than the final level LL sub-band is achieved as follows. A signal(s) Encoding__Strategy will indicate according to some predefined matching (such as that shown in the Table 3 above)

whether the incoming sub-band is to be encoded using the modified ZRLC presented according to various embodiments of the invention, or encoded using pure MHC. The Encoding_Strategy is passed to a Decision Block 520 which passes the flow control to one of two logical paths. If the Encoding_Strategy indicates pure MHC, the Decision Block 520 will pass flow control to LUTs (Look-Up Tables) for MHC 530. Based on the Sub-band, level and/or channel of the data to be encoded, one of the LUTs 530 will be selected and the sub-band data will be encoded according to the MHC. The LUTs 530 are a series of tables that contain the mapping or Huffman code for a given input value. The Huffman code value obtained from LUTs 530 for the given input sub-band data will become the encoded data 570.

If the Encoding_Strategy passed to Decision Block 520 indicates that ZRLC is to be used, then flow control passes to block 525.

The modified $ZRLC_M$, where M is the number of bits for R in the structure (F, R) which encode the run length, is performed by a comparison of the sub-band data value "y" from the DWT block with zero. If this test is true, a counter of Run Length Encoder 560 increases the value r the run length. When a non-zero y (sub-band value) is encountered, this value is used as an address for the LUTs 540 for ZRLC which contain MHC mappings for that non-zero value.

Prior to the MHC for the non-zero value discovered from LUTs 540 being output to, form compressed/encoded data 570, the counter in Run Length Encoder 560 is stopped and the structures (F, R) of M+1 bits are output to become encoded run length for compressed/encoded data 570. The counter in Run Length Encoder 560 is then reset to a value 1, contemporaneous with which the MHC of the encountered non-zero value from LUTs 540 is output to compressed/encoded data 570 such that the MHC follows the structures (F, R) output by Run Length Encoder 560. Run Length Encoder 560 is governed also by three other signals: a Reset, an $M_2$ and $M_3$ signals. The signal Reset indicates the data of the start of a new sub-band. The signal $M_2$ indicates that a $ZRLC_2$ is to be performed where M=2, the size of the word R in the structure (F, R) is 2. When $M_2$ is asserted, a logic network consistent with M=2 will be enabled to operate with the run counter. When $M_3$ is asserted, a logic network consistent with an M of 3, such as that shown in FIG. 4, will be enabled to operate with the run counter. Thus, in one embodiment of the invention, an encoder 560 may be equipped with a plurality of logic networks, each appropriate for a different value of M while all may still use the same counter.

Finally, when the whole sub-band is scanned, if the last y is a zero, only M+1 zeroes are output to represent the terminal word (F, R)=(0, 0).

The coding of the sub-band $LL_{FINAL}$ follows a different data flow. To achieve higher compression simple predictive coding involving quantization and error encoding (block 510) is applied to that L1 sub-band. Instead of coding the quantized coefficients in LL sub-band, the error value between neighboring or successive values is encoded by an entropy coding scheme. These values are coded using pure MHC and thus, use LUTs for MHC 530. The complete set of modified ZRLC are MHC encoded data represents a compressed version of the original raw image. Each "channel" referred to in the DWT Patent may be considered and encoded separately by the logic of FIG. 5, accessing the proper LUTs 530 or 540 which contain MHC values like that shown in Appendices A–E.

Figure 6:
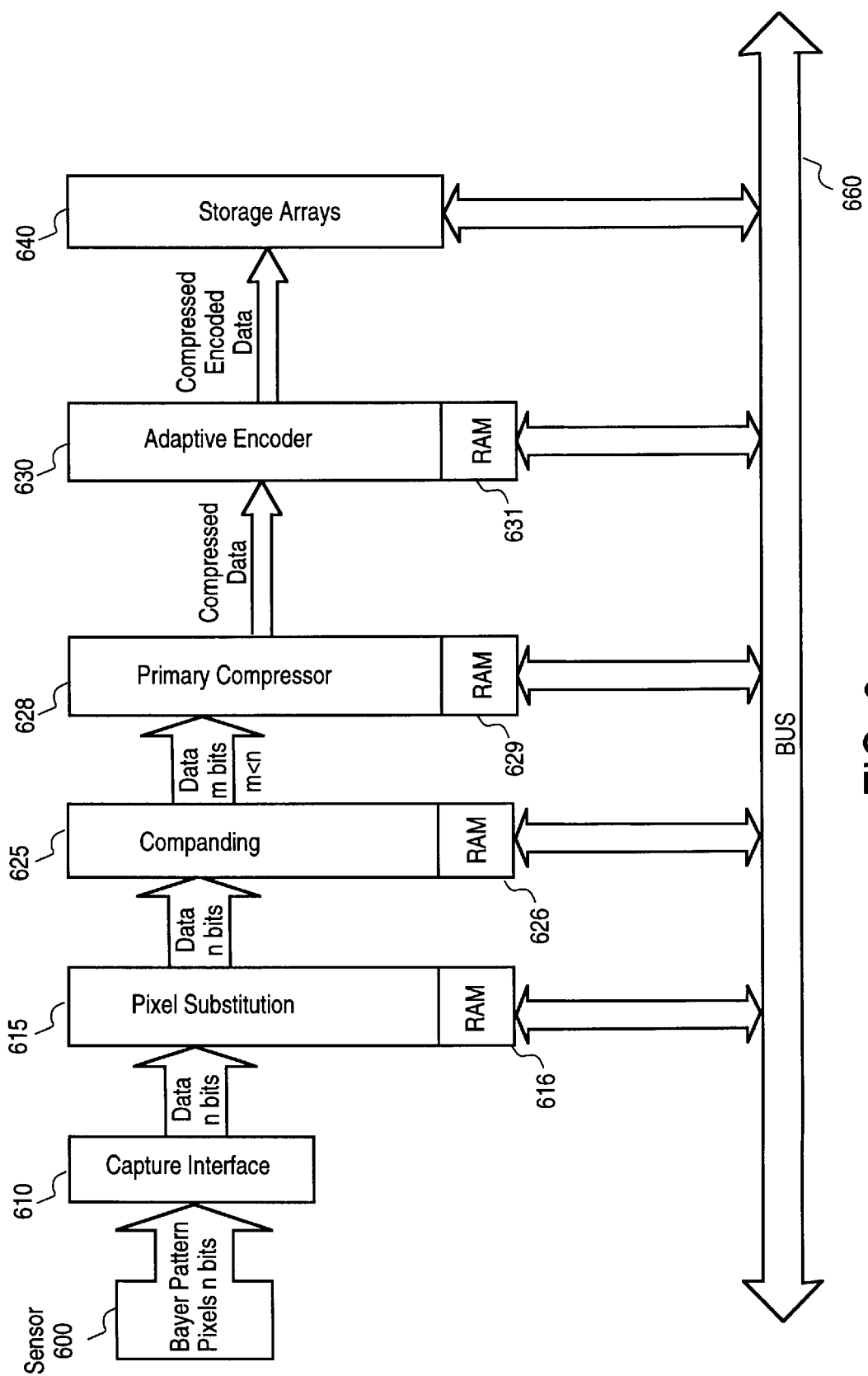
FIG. 6 is a block diagram of an image processing apparatus according to an embodiment of the invention.

FIG. 6 is a block diagram of an image processing apparatus according to an embodiment of the invention.

FIG. 6 is a block diagram of internal image processing components of an imaging device incorporating at least one embodiment of the invention including an adaptive encoder. In the exemplary circuit of FIG. 6, a sensor 600 generates pixel components which are color/intensity values from some scene/environment. The n-bit pixel values generated by sensor 600 are sent to a capture interface 610. Sensor 600 in the context relating to the invention will typically sense one of either R, G, or B components from one "sense" of an area or location. Thus, the intensity value of each pixel is associated with only one of three (or four if G1 and G2 are considered separately) color planes and may form together a Bayer pattern raw image. Capture interface 610 resolves the image generated by the sensor and assigns intensity values to the individual pixels. The set of all such pixels for the entire image is in a Bayer pattern in accordance with typical industry implementation of digital camera sensors.

It is typical in any sensor device that some of the pixel cells in the sensor plane may not respond to the lighting condition in the scene/environment properly. As a result, the pixel values generated from these cell may be defective. These pixels are called "dead pixels." The "pixel substitution" unit 615 replaces each dead pixel by the immediate previously valid pixel in the row. A RAM 616 consists of the row and column indices of the dead pixels, which are supplied by the sensor. This RAM 616 helps to identify the location of dead pixels in relation to the captured image. Companding module 625 is designed to convert each original pixel of n-bit (typically n=10) intensity captured from the sensor to an m-bit intensity value, where m<n (typically, m=8). Companding module 625 is not needed if the sensor 600 and capture interface 610 provide an m-bit per-pixel value.

A primary compressor 628 receives companded sensor image data and performs image compression such as the DWT based compression discussed in the DWT Patent. A RAM 629 can be used to store DWT coefficients and/or quantization thresholds for each channel/sub-band as desired in executing the compression techniques described in the DWT Patent. Primary compressor 628 can be designed to provide compressed channel by channel and sub-band by sub-band outputs to adaptive encoder 630. Adaptive encoder 630 may be designed similar to the design presented in FIGS. 4 and 5. According to one embodiment of the invention, adaptive encoder 630 can be equipped to carry out a variety of binary encoding schemes, such as pure MHC and the modified ZRLC presented in other embodiments of the invention. A RAM 631 may be configured to store the MHC LUTs and the ZRLC LUTs utilized by the adaptive encoder 630. Adaptive encoder 630 provides the encoded and compressed data to storage arrays 640. As a result of adaptive encoding, the storage arrays 640 may be designed smaller in size than those of typical non-adaptive encoders that uniformly apply only one of the many possible binary encoding techniques to image data. Adaptive encoding is particularly advantageous in the encoding of image data, whether compressed or not, since each image (or image compression by-product such as sub-band) may have unique characteristics that would favor one encoding scheme over another.

Each of the RAM tables 616, 626, 629 and 631 can directly communicate with a bus 660 so that their data can be loaded and then later, if desired, modified. Further, those RAM tables and other RAM tables may be used to store intermediate result data as needed. When the data in storage arrays 640 is ready to be transferred external to the imaging apparatus of FIG. 6 it may be placed upon bus 660 for transfer. Bus 660 also facilitates the update of RAM tables 616, 626, 629 and 631 as desired.

Figure 7:
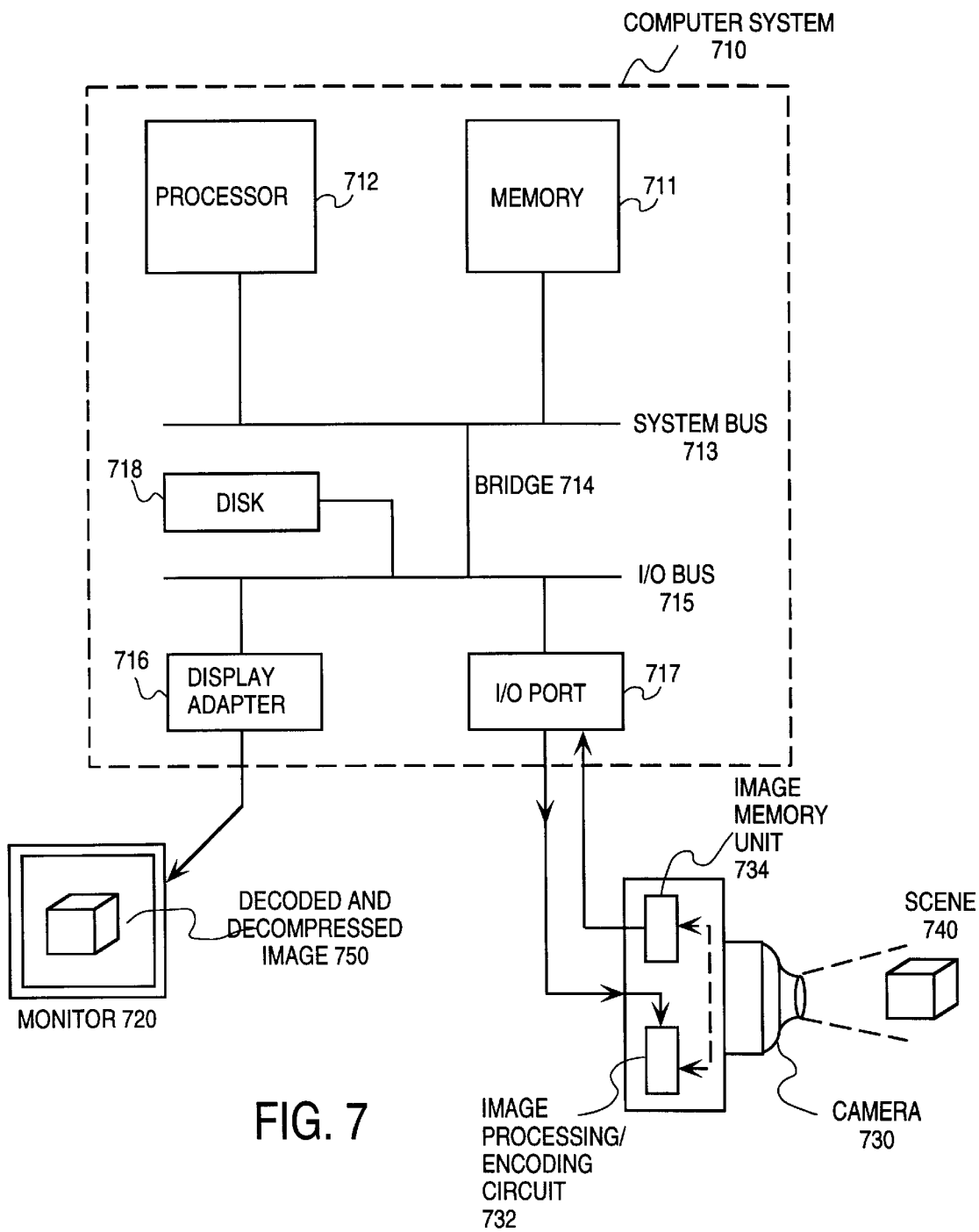
FIG. 7 is a system diagram of one embodiment of the invention.

FIG. 7 is a system diagram of one embodiment of the invention.

Illustrated is a computer system 710, which may be any general or special purpose computing or data processing machine such as a PC(personal computer), coupled to a camera 730. Camera 730 may be a digital camera, digital video camera, or any image capture device or imaging system, or combination thereof and is utilized to capture an image of a scene 740. Essentially, captured images are processed by an image processing circuit 732 so that they can be efficiently stored in an image memory unit 734, which may be a RAM or other storage device such as a fixed disk. The image contained within image memory unit 734 that is destined for computer system 710 can be according to one embodiment of the invention, stored directly as a compressed and adaptively encoded image. In most digital cameras that can perform still imaging, images are stored first and downloaded later. This allows the camera 730 to capture the next object/scene quickly without additional delay. The invention in its various embodiments, particularly in providing a compressed image that is directly converted from the captured 8-bit Bayer pattern, reduces the computation requirements of the camera 730 and the associated costs, allowing for a more inexpensive camera.

The image processing circuit 732 carries out the compression and adaptive encoding in accordance with one or more embodiments of the invention. When a compressed and encoded image is downloaded to computer system 710, it may be decoded and then rendered to some output device such as a printer (not shown) or to a monitor device 720. Image decoding may be achieved using a processor 712 such as the Pentium™ (a product of Intel Corporation) Processor and a memory 711, such as RAM, which is used to store/load instruction addresses and result data. Computer system 710 may provide to camera 730 the LUTs needed for modified ZRLC and MHC shown in FIGS. 5 and 6.

In an alternate embodiment, the adaptive encoding and modified ZRLC techniques described above may be achieved in a software application running on computer system 710 rather than directly in camera 730. In such an embodiment, the image processing circuit may advantageously store only the compressed image. The application(s) used to perform the encoding and/or decoding after download from camera 730 may be from an executable compiled from source code written in a language such as C++. The instructions of that executable file, which correspond with instructions necessary to scale the image, may be stored to a disk 718 or memory 711. Further, such application software may be distributed on a network or a computer-readable medium for use with other systems.

When an image, such as an image of a scene 740, is captured by camera 730, it is sent to the image processing circuit 732. Image processing circuit 732 consists of ICs and other components which execute, among other functions, the adaptive encoding of a compressed image. The image memory unit 734 will store the compressed and encoded data. Once all pixels are processed and stored or transferred to the computer system 710 for rendering the camera 730 is free to capture the next image. When the user or application desires/requests a download of images, the encoded image data in the image memory unit, are transferred from image memory unit 734 to the I/O port 717. I/O port 717 uses the bus-bridge hierarchy shown (I/O bus 715 to bridge 714 to system bus 713) to temporarily store the data into memory 711 or, optionally, disk 718. Computer system 710 has a system bus 713 which facilitates information transfer to/from the processor 712 and memory 711 and a bridge 714 which couples to an I/O bus 715. I/O bus 715 connects various I/O devices such as a display adapter 716, disk 718 and an I/O port 717, such as a serial port. Many such combinations of I/O devices, buses and bridges can be utilized with the invention and the combination shown is merely illustrative of one such possible combination.

In another embodiment of the invention, the modified ZRLC encoding and adaptive encoding may be utilized to perform the compression of ordinary non-image data such as the compression of text files as well. Such data may be stored in a disk, memory 711 or other storage mechanism and can be compressed by virtue of being encoded adaptively. In such encoding of data, it may be possible to detect which portions of the data stream may be encoded using a modified ZRLC and which may be encoded using MHC. In data that contains a large number of consecutive zeroes, a modified ZRLC scheme that is capable of representing an arbitrarily large run-length value would be particularly efficient. In data that shows high entropy, MHC may be more suitable.

The exemplary embodiments described herein are provided merely to illustrate the principles of the invention and should not be construed as limiting the scope of the invention. Rather, the principles of the invention may be applied to a wide range of systems to achieve the advantages described herein and to achieve other advantages or to satisfy other objectives as well.

APPENDIX A

Huffman tables for the R channel
CHANNEL R

| Level 1, Band HL, LH | | Level 1, Band HH | | | |
|---|---|---|---|---|---|
| Range | Code | Range | Code | | |
| 0 | 0 | 0 | 0 | | |
| 1 | 10 | 1 | 10 | | |
| 2 | 110 | 2 | 110 | | |
| 3 | 1110 | 3 | 111 | | |
| 4 | 11110 | | | | |
| 5 | 11111 | | | | |

| Level 2, Band HL, LH | | Level 2, Band HH | | | |
|---|---|---|---|---|---|
| Range | Code | Range | Code | | |
| 0 | 0 | 0 | 0 | | |
| 1 | 10 | 1 | 10 | | |
| 2 | 110 | 2 | 110 | | |
| 3 | 1110 | 3 | 1110 | | |
| 4 | 11110 | 4 | 11110 | | |
| 5 | 111110 | 5 | 11111 | | |
| 6 | 111111 | | | | |

| Level 3, Band HL, LH | | Level 3, Band HH | | Level 3, Band LL | |
|---|---|---|---|---|---|
| Range | Code | Range | Code | Range | Code |
| 0 | 0 | 0 | 0 | 0 | 011 |
| 1 | 10 | 1 | 10 | 1 | 11 |
| 2 | 110 | 2 | 110 | 2 | 10 |
| 3 | 1110 | 3 | 1110 | 3 | 000 |
| 4 | 11110 | 4 | 11110 | 4 | 001 |
| 5 | 111110 | 5 | 111110 | 5 | 0100 |
| 6 | 1111110 | 6 | 111111 | 6 | 01010 |
| 7 | 1111111 | | | 7 | 01011 |

| Level 4, Band HL, LH | | Level 4, Band HH | | Level 4, Band LL | |
|---|---|---|---|---|---|

APPENDIX A-continued

Huffman tables for the R channel
CHANNEL R

| Range | Code | Range | Code | Range | Code |
|---|---|---|---|---|---|
| 0 | 01 | 0 | 0 | 0 | 101 |
| 1 | 10 | 1 | 10 | 1 | 010 |
| 2 | 11 | 2 | 110 | 2 | 11 |
| 3 | 001 | 3 | 1110 | 3 | 000 |
| 4 | 0000 | 4 | 11110 | 4 | 001 |
| 5 | 00010 | 5 | 111110 | 5 | 011 |
| 6 | 000110 | 6 | 1111110 | 6 | 1000 |
| 7 | 0001110 | 7 | 1111111 | 7 | 10010 |
| 8 | 0001111 |  |  | 8 | 10011 |

APPENDIX B

Huffman tables for the G1 and G2 channel
CHANNELS G1 and G2

Level 1, Band HL, LH | Level 1, Band HH

| Range | Code | Range | Code |
|---|---|---|---|
| 0 | 0 | 0 | 0 |
| 1 | 10 | 1 | 10 |
| 2 | 110 | 2 | 110 |
| 3 | 1110 | 3 | 111 |
| 4 | 11110 |  |  |
| 5 | 11111 |  |  |

Level 2, Band HL, LH | Level 2, Band HH

| Range | Code | Range | Code |
|---|---|---|---|
| 0 | 0 | 0 | 0 |
| 1 | 10 | 1 | 10 |
| 2 | 110 | 2 | 110 |
| 3 | 1110 | 3 | 1110 |
| 4 | 11110 | 4 | 11110 |
| 5 | 111110 | 5 | 11111 |
| 6 | 111111 |  |  |

Level 3, Band HL, LH | Level 3, Band HH | Level 3, Band LL

| Range | Code | Range | Code | Range | Code |
|---|---|---|---|---|---|
| 0 | 0 | 0 | 0 | 0 | 011 |
| 1 | 10 | 1 | 10 | 1 | 11 |
| 2 | 110 | 2 | 110 | 2 | 10 |
| 3 | 1110 | 3 | 1110 | 3 | 000 |
| 4 | 11110 | 4 | 11110 | 4 | 001 |
| 5 | 111110 | 5 | 111110 | 5 | 0100 |
| 6 | 1111110 | 6 | 1111110 | 6 | 01010 |

Level 4, Band HL, LH | Level 4, Band HH | Level 4, Band LL

| Range | Code | Range | Code | Range | Code |
|---|---|---|---|---|---|
| 0 | 01 | 0 | 0 | 0 | 101 |
| 1 | 10 | 1 | 10 | 1 | 010 |
| 2 | 11 | 2 | 110 | 2 | 11 |
| 3 | 001 | 3 | 1110 | 3 | 000 |
| 4 | 0000 | 4 | 11110 | 4 | 001 |
| 5 | 00010 | 5 | 111110 | 5 | 011 |
| 6 | 000110 | 6 | 1111110 | 6 | 1000 |
| 7 | 0001110 | 7 | 1111111 | 7 | 10010 |
| 8 | 0001111 |  |  | 8 | 10011 |

APPENDIX C

Huffman tables for the B channel
CHANNEL B

Level 1, Band HL, LH | Level 1, Band HH

| Range | Code | Range | Code |
|---|---|---|---|
| 0 | 0 | 0 | 0 |
| 1 | 10 | 1 | 10 |
| 2 | 110 | 2 | 110 |
| 3 | 1110 | 3 | 111 |
| 4 | 11110 |  |  |
| 5 | 11111 |  |  |

Level 2, Band HL, LH | Level 2, Band HH

| Range | Code | Range | Code |
|---|---|---|---|
| 0 | 0 | 0 | 0 |
| 1 | 10 | 1 | 10 |
| 2 | 110 | 2 | 110 |
| 3 | 1110 | 3 | 1110 |
| 4 | 11110 | 4 | 1111 |
| 5 | 111110 |  |  |
| 6 | 111111 |  |  |

Level 3, Band HL, LH | Level 3, Band HH | Level 3, Band LL

| Range | Code | Range | Code | Range | Code |
|---|---|---|---|---|---|
| 0 | 0 | 0 | 0 | 0 | 011 |
| 1 | 10 | 1 | 10 | 1 | 11 |
| 2 | 1 | 2 | 110 | 2 | 10 |
| 3 | 1110 | 3 | 1110 | 3 | 000 |
| 4 | 11110 | 4 | 11110 | 4 | 001 |
| 5 | 111110 | 5 | 111110 | 5 | 0100 |
| 6 | 1111110 | 6 | 111111 | 6 | 01010 |
| 7 | 1111111 |  |  | 7 | 01011 |

Level 4, Band HL, LH | Level 4, Band HH | Level 4, Band LL

| Range | Code | Range | Code | Range | Code |
|---|---|---|---|---|---|
| 0 | 0 | 0 | 0 | 0 | 101 |
| 1 | 10 | 1 | 10 | 1 | 010 |
| 2 | 110 | 2 | 110 | 2 | 11 |
| 3 | 1110 | 3 | 1110 | 3 | 000 |
| 4 | 11110 | 4 | 11110 | 4 | 001 |
| 5 | 111110 | 5 | 111110 | 5 | 011 |
| 6 | 1111110 | 6 | 1111110 | 6 | 1000 |
| 7 | 1111111 | 7 | 1111111 | 7 | 10010 |
|  |  |  |  | 8 | 10011 |

APPENDIX D

Huffman tables for the [R-G1] channel
CHANNEL [R-G1]

Level 1, Band HL, LH

| Range | Code |
|---|---|
| 0 | 0 |
| 1 | 10 |
| 2 | 110 |
| 3 | 1110 |
| 4 | 1111 |

Level 2, Band HL, LH | Level 2, Band HH

| Range | Code | Range | Code |
|---|---|---|---|
| 0 | 0 | 0 | 0 |
| 1 | 10 | 1 | 10 |
| 2 | 110 | 2 | 110 |
| 3 | 1110 | 3 | 1110 |

APPENDIX D-continued

Huffman tables for the [R-G1] channel
CHANNEL [R-G1]

| 4 | 11110 | 4 | 11110 |
| 5 | 111110 | 5 | 11111 |
| 6 | 111111 | | |

| Level 3, Band HL, LH | | Level 3, Band HH | | Level 3, Band LL | |
| --- | --- | --- | --- | --- | --- |
| Range | Code | Range | Code | Range | Code |
| 0 | 0 | 0 | 0 | 0 | 011 |
| 1 | 10 | 1 | 10 | 1 | 11 |
| 2 | 110 | 2 | 110 | 2 | 10 |
| 3 | 1110 | 3 | 1110 | 3 | 000 |
| 4 | 11110 | 4 | 11110 | 4 | 001 |
| 5 | 111110 | 5 | 111110 | 5 | 0100 |
| 6 | 1111110 | 6 | 1111110 | 6 | 01010 |
| 7 | 11111110 | 7 | 1111111 | 7 | 010110 |
| 8 | 11111111 | | | 8 | 010111 |

| Level 4, Band HL, LH | | Level 4, Band HH | | Level 4, Band LL | |
| --- | --- | --- | --- | --- | --- |
| Range | Code | Range | Code | Range | Code |
| 0 | 0 | 0 | 0 | 0 | 011 |
| 1 | 10 | 1 | 10 | 1 | 11 |
| 2 | 110 | 2 | 1 | 2 | 10 |
| 3 | 1110 | 3 | 1110 | 3 | 000 |
| 4 | 11110 | 4 | 11110 | 4 | 001 |
| 5 | 111110 | 5 | 111110 | 5 | 0100 |
| 6 | 1111110 | 6 | 1111110 | 6 | 01010 |
| 7 | 11111110 | 7 | 11111110 | 7 | 010110 |
| 8 | 11111111 | 8 | 11111111 | 8 | 010111 |

APPENDIX E

Huffman tables for the [B-G2] channel
CHANNEL [B-G2]

| Level 1, Band HL, LH | |
| --- | --- |
| Range | Code |
| 0 | 0 |
| 1 | 10 |
| 2 | 110 |
| 3 | 1110 |
| 4 | 1111 |

| Level 2, Band HL, LH | | Level 2, Band HH | |
| --- | --- | --- | --- |
| Range | Code | Range | Code |
| 0 | 0 | 0 | 0 |
| 1 | 10 | 1 | 10 |
| 2 | 110 | 2 | 110 |
| 3 | 1110 | 3 | 1110 |
| 4 | 11110 | 4 | 1111 |
| 5 | 11111 | | |

| Level 3, Band HL, LH | | Level 3, Band HH | | Level 3, Band LL | |
| --- | --- | --- | --- | --- | --- |
| Range | Code | Range | Code | Range | Code |
| 0 | 0 | 0 | 0 | 0 | 011 |
| 1 | 10 | 1 | 10 | 1 | 11 |
| 2 | 110 | 2 | 110 | 2 | 10 |
| 3 | 1110 | 3 | 1110 | 3 | 000 |
| 4 | 11110 | 4 | 11110 | 4 | 001 |
| 5 | 111110 | 5 | 11111 | 5 | 0100 |
| 6 | 1111110 | | | 6 | 01010 |
| 7 | 1111111 | | | 7 | 01011 |

| Level 4, Band HL, LH | | Level 4, Band HH | | Level 4, Band LL | |
| --- | --- | --- | --- | --- | --- |

APPENDIX E-continued

Huffman tables for the [B-G2] channel
CHANNEL [B-G2]

| Range | Code | Range | Code | Range | Code |
| --- | --- | --- | --- | --- | --- |
| 0 | 0 | 0 | 0 | 0 | 011 |
| 1 | 10 | 1 | 10 | 1 | 11 |
| 2 | 110 | 2 | 110 | 2 | 10 |
| 3 | 1110 | 3 | 1110 | 3 | 000 |
| 4 | 11110 | 4 | 11110 | 4 | 001 |
| 5 | 111110 | 5 | 111110 | 5 | 0100 |
| 6 | 1111110 | 6 | 1111110 | 6 | 01010 |
| 7 | 1111111 | 7 | 1111111 | 7 | 01011 |

What is claimed is:

1. A method comprising:

determining the number of bits utilized to store a word R, said word R accompanied by a flag, said flag and word R comprising a structure;

specifying a structure with a flag of 1 indicating that the corresponding word R in said structure with a flag of 1 forms a portion of the length of the run, such that the word R in the next structure value is adjacent, and specifying a structure with a flag of 0 indicating the corresponding word R is the most significant portion of the length of the run; and encoding the length of a run larger than allowable by said number of bits of the word R even if each of said bits were fully utilized, said encoding achieved by stringing together a plurality of said structures.

2. A method according to claim 1 wherein said run refers to the number of zeroes between two non-zero values in a set of data.

3. A method according to claim 2 wherein said non-zero values are encoded using a Modified Huffman Coding.

4. A method according to claim 3 wherein said non-zero values are used to address a look-up table and derive therefrom the Huffman code corresponding to said non-zero values.

5. A method according to claim 2 wherein said set of data is sub-band data obtained from a Discrete Wavelet Transform (DWT).

6. A method according to claim 5 wherein said set of data is further distinguished by a channel, said channel relating to a color property of said set of data when said DWT is performed upon an image.

7. A method according to claim 1 wherein a structure with a flag of 1 and a word R of 1 indicates that the non-zero value following said structure with a flag of zero and word R of 1 is adjacent to the previous non-zero value.

8. A method of encoding image data from a difference and color channel adaptive transform of an image, the data including a color channel and sub-band data, the method comprising:

identifying the transform channel and sub-band for a set of image data;

selecting for each channel and each sub-band of image data, one of a plurality of encoding schemes; and applying said selected one encoding scheme to said image data for which said encoding scheme was selected.

9. A method according to claim 8 wherein said encoding schemes includes Modified Huffman Coding and modified Zero Run Length Coding.

10. The method of claim 8 wherein applying said selected one encoding scheme further comprises:

determining the number of bits utilized to store a word R, said word R accompanied by a flag, said flag and word R comprising a structure; and encoding the length of a run larger than allowable by said number of bits of the word R even if each of said bits were fully utilized, said encoding achieved by stringing together a plurality of said structures.

11. A method according to claim 10 wherein said run refers to the number of zeroes between two non-zero values in a set of data.

12. A method according to claim 11 wherein said non-zero values are used to address a look-up table and derive therefrom the Huffman code corresponding to said non-zero values.

13. A method according to claim 10 wherein encoding includes:
specifying a structure with a flag of 1 indicating that the corresponding word R in said structure with a flag of 1 forms a portion of the length of the run, such that the word R in the next structure value is adjacent, and specifying a structure with a flag of 0 indicating the corresponding word R is the most significant portion of the length of the run.

14. A method according to claim 13 wherein a structure with a flag of 1 and a word R of 1 indicates that the non-zero value following said structure with a flag of zero and word R of 1 is adjacent to the previous non-zero value.

15. An apparatus comprising:
an N-bit counter segmented into groups of M bits each, M comprising the length of the word R in an enhanced Zero Run Length Coding scheme for encoding data values; and
a logic network coupled to said counter, said logic network configured to set flags and enable the output of selected said groups of M bits from said counter.

16. An apparatus according to claim 15 wherein said counter is stopped and reset to 1 when a non-zero value is encountered in said data values.

17. An apparatus according to claim 16 wherein said counter is incremented by 1 when a zero value is encountered in said data values.

18. An apparatus according to claim 15 wherein said logic network comprises:
a first OR gate configured to receive the M most significant bits of said counter as inputs thereto;
a second OR gates configured to receive the next group of M most significant bits and the output of said first OR gate as inputs thereto; and
a third OR gate configured to receive the group of M most significant bits succeeding those received by said second OR gate and to receive the output of said second OR gate as inputs thereto.

19. An apparatus according to claim 18 wherein said first OR gate output sets the flag of the second most significant M bits of said counter, said second OR gate output sets the flag of the next M bits of said counter, and said third OR gate sets the flag of the structure belonging to the most significant M bits of said counter.

20. An apparatus according to claim 19 wherein said enable signals are provided as a logic combination of a stop and reset signal input to said counter and selected flags, said flag of the most significant M bits always set to zero.

21. An apparatus according to claim 19 wherein M=3.

22. An apparatus according to claim 15 wherein said logic network is modified for different values of M.

23. A method comprising:
decoding a run of like values in a data stream by extracting structures therefrom, each structure comprising of a word R and a flag;

if said flag is a 1, the corresponding word R in that structure is determined to form a portion of the length of the run such that the R value in the next structure is adjacent thereto; and
if said flag is a 0, the corresponding R is the most significant portion of the length of the run.

24. A method according to claim 23 wherein a structure with a flag of 1 and a word R of 1 indicates that the non-zero value following said structure with a flag of zero and word R of 1 is adjacent to the previous non-zero value.

25. A system comprising:
an optical subsystem configured to receive light represented as pixel values stored in an array, said array constituting raw image data;
an image processor configured to encode said raw image data by adaptively: determining the number of bits utilized to store a word R, said word R accompanied by a flag, said flag and word R comprising a structure;
specifying a structure with a flag of 1 indicating that the corresponding word R in said structure with a flag of 1 forms a portion of the length of the run, such that the word R in the next structure value is adjacent, and specifying a structure with a flag of 0 indicating the corresponding word R is the most significant -portion of the length of the run; and
encoding the length of a run larger than allowable by said number of bits of the word R even if each of said bits were fully utilized, said encoding achieved by stringing together a plurality of said structures; and
an image memory configured to store said adaptively encoded data.

26. A system according to claim 25 wherein said optical subsystem is part of a digital camera.

27. A system according to claim 25 wherein said optical subsystem is part of a scanner.

28. A method according to claim 25 wherein said run refers to the number of zeroes between two non-zero values in a set of data.

29. A method according to claim 28 wherein said set of data is sub-band data obtained from a Discrete Wavelet Transform (DWT).

30. A method according to claim 29 wherein said set of data is further distinguished by a channel, said channel relating to a color property of said set of data when said DWT is performed upon an image.

31. A method according to claim 28 wherein said non-zero values are used to address a look-up table and derive therefrom the Huffman code corresponding to said non-zero values.

32. A machine-readable medium having stored thereon data representing sequences of instructions which, when executed by a processor, cause the processor to perform the steps of:
identifying a transform channel and a sub-band for a set of image data;
selecting for each channel and each sub-band of image data, one of a plurality of encoding schemes; and
applying said selected one encoding scheme to said image data for which said encoding scheme was selected.

33. The method of claim 32 wherein applying said selected one encoding scheme further comprises:
determining the number of bits utilized to store a word R, said word R accompanied by a flag, said flag and word R comprising a structure; and
encoding the length of a run larger than allowable by said number of bits of the word R even if each of said bits were fully utilized, said encoding achieved by stringing together a plurality of said structures.

34. A method according to claim 33 wherein said run refers to the number of zeroes between two non-zero values in a set of data.

35. A method according to claim 34 wherein said non-zero values are used to address a look-up table and derive therefrom the Huffman code corresponding to said non-zero values.

36. A method according to claim 33 wherein encoding includes:

specifying a structure with a flag of 1 indicating that the corresponding word R in said structure with a flag of 1 forms a portion of the length of the run, such that the word R in the next structure value is adjacent, and specifying a structure with a flag of 0 indicating the corresponding word R is the most significant portion of the length of the run.

37. A method according to claim 36 wherein a structure with a flag of 1 and a word R of 1 indicates that the non-zero value following said structure with a flag of zero and word R of 1 is adjacent to the previous non-zero value.

* * * * *